(12) United States Patent
Kastelic et al.

(10) Patent No.: US 11,399,432 B2
(45) Date of Patent: Jul. 26, 2022

(54) COMPONENT CARRIER WITH AN ETCHING NECK CONNECTING BACK DRILL HOLE WITH VERTICAL THROUGH CONNECTION

(71) Applicant: AT&S Austria Technologie & Systemtechnik Aktiengesellschaft, Leoben (AT)

(72) Inventors: Markus Kastelic, Zeltweg (AT); Lackner Sebastian, Kammern (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/248,109

(22) Filed: Jan. 8, 2021

(65) Prior Publication Data

US 2021/0219422 A1    Jul. 15, 2021

(30) Foreign Application Priority Data

Jan. 14, 2020  (EP) ..................................... 20151739

(51) Int. Cl.
  *H05K 1/02*   (2006.01)
  *H05K 1/11*   (2006.01)
  *H05K 3/42*   (2006.01)

(52) U.S. Cl.
  CPC ........... *H05K 1/116* (2013.01); *H05K 1/0243* (2013.01); *H05K 1/0268* (2013.01);
  (Continued)

(58) Field of Classification Search
  CPC ........ H05K 1/116; H05K 1/0268; H05K 3/42; H05K 2201/09545; H05K 3/0047;
  (Continued)

(56) References Cited

U.S. PATENT DOCUMENTS 7,337,537 B1 *  3/2008  Smetana, Jr. .......... H05K 3/429
                                                    29/846
2005/0128672 A1 *  6/2005  Tourne ................. H05K 3/0047
                                                    361/119
(Continued)

FOREIGN PATENT DOCUMENTS

CN  101861055 A  10/2010
CN  101998768 A   3/2011
(Continued)

OTHER PUBLICATIONS

Degroote, B.; Partial European Search Report in Application No. EP 20 15 1739; pp. 1-8; Sep. 9, 2020; European Patent Office, 80298, Munich, Germany.
(Continued)

*Primary Examiner* — Steven T Sawyer
(74) *Attorney, Agent, or Firm* — Robert A. Blaha; Smith Tempel Blaha LLC (57) ABSTRACT

A component carrier includes a stack with a plurality of electrically conductive layer structures and at least one electrically insulating layer structure. The electrically conductive layer structures include an electrically conductive vertical through-connection and a horizontally extending electrically conductive trace electrically coupled with an end portion of the vertical through-connection. A back-drill hole extends through at least part of the at least one electrically insulating layer structure towards the end portion of the vertical through-connection. An etching neck connects the back-drill hole with the end portion of the vertical through-connection.

14 Claims, 4 Drawing Sheets

(52) U.S. Cl.
CPC .............. *H05K 1/0298* (2013.01); *H05K 3/42* (2013.01); *H05K 2201/09545* (2013.01); *H05K 2201/10098* (2013.01)

(58) Field of Classification Search
CPC ........... H05K 3/429; H05K 2203/0207; H05K 1/0251; H05K 1/02
See application file for complete search history.

(56) References Cited

U.S. PATENT DOCUMENTS

| | | | |
|---|---|---|---|
| 2009/0045889 A1* | 2/2009 | Goergen | H05K 1/0216 174/266 |
| 2010/0045537 A1* | 2/2010 | Satomi | H01P 1/047 343/700 MS |
| 2010/0276192 A1* | 11/2010 | Pai | H05K 3/4623 174/266 |
| 2011/0240348 A1 | 10/2011 | Lau | |
| 2012/0012380 A1 | 1/2012 | Miller | |
| 2012/0302075 A1* | 11/2012 | Muraoka | H05K 1/115 174/266 |
| 2015/0208514 A1* | 7/2015 | Thomas | H05K 3/429 205/125 |
| 2015/0264804 A1* | 9/2015 | Huang | H05K 1/115 174/262 |
| 2017/0231099 A1* | 8/2017 | Mundt | H05K 1/115 |

FOREIGN PATENT DOCUMENTS

| | | |
|---|---|---|
| CN | 103533761 A | 1/2014 |
| CN | 105491800 A | 4/2016 |
| CN | 105636357 A | 6/2016 |

OTHER PUBLICATIONS

Degroote, B.; Communication in Application No. EP 20 15 739.8; pp. 1-5; Jun. 25, 2020; European Patent Office, Postbus 5818, 2280 HV Rijswjik, Netherlands.

* cited by examiner

COMPONENT CARRIER WITH AN ETCHING NECK CONNECTING BACK DRILL HOLE WITH VERTICAL THROUGH CONNECTION

TECHNICAL FIELD

The disclosure relates to a component carrier, to a method of manufacturing a component carrier, and to a method of use.

BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, parasitic effects (like insertion losses, distortion, etc.) may occur when high-frequency signals propagate along wiring structures of a component carrier. Such parasitic effects may substantially degrade the overall performance of mobile communication systems, etc.

SUMMARY

There may be a need to provide a component carrier with high performance in terms of signal transmission.

A component carrier, a method of manufacturing a component carrier, and a method of use according to the independent claims are provided.

According to an exemplary embodiment of the invention, a component carrier is provided, wherein the component carrier comprises a stack comprising a plurality of electrically conductive layer structures and at least one electrically insulating layer structure, wherein the electrically conductive layer structures comprise an electrically conductive vertical through-connection and a horizontally extending electrically conductive trace electrically coupled with an end portion of the vertical through-connection, a back-drill hole extending through at least part of the at least one electrically insulating layer structure towards the end portion, and an etching neck connecting the back-drill hole with the end portion of the vertical through-connection.

According to another exemplary embodiment of the invention, a method of manufacturing a component carrier is provided, wherein the method comprises providing a stack comprising a plurality of electrically conductive layer structures and at least one electrically insulating layer structure, forming the electrically conductive layer structures with an electrically conductive vertical through-connection and a horizontally extending electrically conductive trace electrically coupled with the vertical through-connection, drilling a back-drill hole through at least part of the at least one electrically insulating layer structure and into the vertical through-connection, and etching an etching neck between the back-drill hole and an end portion of the vertical through-connection.

According to still another exemplary embodiment of the invention, electrically conductive wiring structures of a component carrier having the above-mentioned features are used for a high-frequency application, in particular for conducting a radio-frequency (RF) signal, in particular a RF signal with a frequency above 1 GHz.

Overview of Embodiments

According to yet another exemplary embodiment of the invention, a component carrier is provided, wherein the component carrier comprises a stack comprising a plurality of electrically conductive layer structures and at least one electrically insulating layer structure, wherein the electrically conductive layer structures comprise an electrically conductive vertical through-connection and a horizontally extending electrically conductive trace electrically coupled with an end portion of the vertical through-connection, a back-drill hole extending through at least part of the at least one electrically insulating layer structure towards the end portion, and a test structure which comprises at least one horizontally extending electrically conductive dummy trace at a vertical level of and connected to the back-drill hole and/or at a vertical level of and connected to an optional etching neck connecting the back-drill hole with the end portion of the vertical through-connection.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "high-frequency application" may particularly denote a task fulfilled by the component carrier or to which the component carrier contributes, wherein the task may relate to the handling of a RF signal. Such a radio or high-frequency signal may be an electric or electromagnetic signal propagating along the wiring structure (which may encompass the trace and the vertical through-connection) in a range of frequencies used for communications or other signals. In particular, a RF signal may for example have a frequency in the range between 3 kHz and 300 GHz.

In the context of the present application, the term "vertical through-connection" may particularly denote an electrically conductive structure which extends along a stacking direction of the layer structures of the stack of a component carrier. Such a component carrier may be a flat body, and the vertical through-connection may extend along the thinnest direction of such a component carrier. For instance, such a vertical through-connection may be a plated via. A corresponding through hole may be formed for instance by mechanically drilling or by laser drilling.

In the context of the present application, the term "horizontally extending electrically conductive trace" may particularly denote an electrically conductive structure extending perpendicular to the vertical through-connection or within a horizontal plane of a stacked layer sequence of the component carrier. For example, the at least one electrically conductive trace may be electrically connected within the component carrier so as to carry an electric current or an electric signal, in particular a high-frequency signal, within the horizontal plane. For forming such a horizontal trace, a metal layer (such as a copper sheet) forming part of the stack may be patterned.

In the context of the present application, the term "back-drill hole" may particularly denote a hole drilled in the stack of the component carrier and extending from a (for instance back) main surface of the component carrier up to an interior of the stack. In particular, a back-drill hole may be formed by drilling, in particular by mechanically drilling through part of the layer stack. The back-drill hole may extend from an exterior main surface of the component carrier up to an end or end portion of the vertical through-connection. It has turned out that the formation of such a back-drill hole may improve the properties of the component carrier in particular in terms of processing high-frequency signals, for instance RF signals, since it may reduce the length of a parasitic stub extending vertically beyond a vertical connection position of the vertical through-connection with the horizontal trace.

In the context of the present application, the term "etching neck" may particularly denote a laterally narrowed portion or extension of the back-drill hole which may have a smaller diameter (in particular a smaller maximum diameter) in a horizontal plane than the back-drill hole. In particular, an etching neck may be formed and dimensioned in a way so as to be formable by etching or formed by etching. Descriptively speaking, a locally narrowed etching neck may provide a vertical extension of the back-drill hole which partially or entirely bridges a space between an end portion of the back-drill hole and a vertical position of the at least one electrically conductive trace.

According to an exemplary embodiment of the invention, a component carrier may be provided which has excellent properties in terms of processing high-frequency signals. According to an exemplary embodiment, this can be accomplished by not only forming a back-drill hole in a stack of a component carrier which already improves the high-frequency properties, but by additionally extending the drilled back-drill hole with a locally narrowed portion. The latter may be properly formed by etching which may extend the length of the hole extending into the stack to further reduce the length of a parasitic stub of electrically conductive material at an interface between a vertical through-connection and a horizontal electrically conductive trace. Conventionally, such a stub may remain in the stack with a considerable length, since a back-drill hole may not extend vertically fully up to the trace to ensure maintenance of an electric connection between the electrically conductive trace and the vertical through-connection. Since it is difficult to precisely define the length of a back-drill hole during a drilling procedure, a corresponding inaccuracy shall be considered conventionally which may result in a relatively long remaining stub. However, since an etching process can be properly controlled, execution of a precisely controlled etching procedure after drilling the back-drill hole may reduce the stub length by forming a locally narrowed extension of the back-drill hole. This may further reduce the length of the stub which may significantly improve the high-frequency properties. At the same time, an undesired disconnection of trace and vertical through-connection by a back hole of excessive length may be safely prevented due to the high accuracy and controllability of the etching process used for creating the etching neck. Descriptively speaking, the length of a copper-filled blind hole extending as a parasitic effect vertically beyond the target end of the vertical through-connection may be shortened or even eliminated by forming a locally narrowed etching neck. Advantageously, this may be accomplished without the risk of unintentionally separating the connected electrically conductive structures in form of the vertical through-connection and the horizontal trace. Thereby, a high electric reliability can be combined with excellent high-frequency properties of the component carrier. At the same time, it may be possible to create one or more back-drill holes for HF (high-frequency) boards without any burr inside the holes. Removal of any burr remaining after a drilling process is another characteristic advantage of the etching process implemented for creating the etching neck. Also, unwanted inner layer connections, which may conventionally result from a too short back-drill hole, may be prevented by the mentioned additional etching procedure forming the etching neck and contributing to separate unwanted inner layer connections.

According to another exemplary embodiment of the invention, a component carrier with an integrally formed test structure may be provided. When a back-drill hole is formed correctly, a dummy trace connected with the back-drill hole will not be capable of receiving an electric signal applied to the electrically conductive trace or the vertical through-connection (or applied in opposite direction), since the back-drill hole will disconnect the corresponding electric path. Correspondingly, when an etching neck is formed correctly, a dummy trace connected with the etching neck will not be capable of receiving an electric signal applied to the electrically conductive trace or the vertical through-connection (or applied in opposite direction), since the etching neck will disconnect the corresponding electric path. However, applying a test signal to or between traces connected with the vertical through-connection (for instance at the top side and at the bottom side) should allow detecting a response signal when the connection between the vertical through-connection and said trace(s) is properly established. Thus, the described test structure allows reliably testing the functioning of the back-drill hole (and the connected etching neck, if present) by carrying out a non-destructive test process using the described hardware test structure.

In the following, further exemplary embodiments of the component carriers and the methods will be explained.

A gist of an exemplary embodiment is to carry out back drilling to remove an unused portion (also denoted as a stub) of a copper barrel from a plated through hole in a printed circuit board (PCB) or other kind of component carrier. Highly advantageously, a drilling procedure for removing such an unused portion may be followed by an additional etching process. When high-speed signals travel between layers through a path, they can be distorted. If the signal layer usage results in a stub and the stub is too long, the distortion becomes significant. Moreover, a drilling burr may occur conventionally inside the holes, which may have an impact on the performance, as this burr cannot be controlled. On the other hand, the remaining stub may still have a considerable length after drilling, as the tolerances of the depth drilling have to be considered. To avoid such issues, an exemplary embodiment of the invention adds an etching procedure (like alkaline, acid or dry etching procedures) after back drilling to remove the burr partially or completely, and reduce additionally the remaining stub length without damaging the functional part of the hole. Advantageously, an uncontrolled burr may be prevented in the back-drill hole according to an exemplary embodiment.

Additionally, reducing the remaining stub length may ensure a more stable and repeatable performance of HF features.

In an embodiment, the vertical through-connection is a plated via. Hence, the vertical through-connection may be formed by drilling a hole by mechanical treatment or by laser drilling or even by etching, followed with an at least partial filling of the formed through hole with an electrically conductive filling medium such as copper by plating. For example, plating may include the formation of a seed layer lining the for example substantially cylindrical sidewall of the created hole. Such a seed layer formation may be accomplished for example by electroless deposition or sputtering. Said process may then be followed, optionally, by at least one further plating process such as galvanic plating. By galvanic plating, a high amount of electrically conductive filling medium may be filled in the hole.

In an embodiment, the component carrier comprises a land or pad electrically connecting the electrically conductive trace with the vertical through-connection. Descriptively speaking, such a land or pad may balance out tolerances between the electrically conductive trace and the vertical through-connection. If, for instance, such a tolerance has the consequence that the mutual positions of the vertical through-connection and the electrically conductive trace do not match sufficiently, it may happen that a physical contact establishing an electric connection between trace and vertical through-connection is not present or is present only partially. By however providing a land as a horizontally extended pad portion of the vertical through-connection connected to the electrically conductive trace, such tolerances may be compensated. For instance, such a land may be a circular, rectangular or annular electrically conductive sheet portion connecting to both the trace and the vertical through-connection.

In an embodiment, the vertical through-connection comprises an electrically conductive stub between the etching neck and the electrically conductive trace. Such a stub may be a short electrically conductive extension of the vertical through-connection protruding beyond the vertical level of the trace. Such a parasitic stub constitutes a loss mechanism for high-frequency signals propagating along the trace and the vertical through-connection and partially propagating into the blind hole formed by the stub. Such a stub is thus a parasitic effect and deteriorates the RF performance of the component carrier and should therefore be kept as short as possible. According to an exemplary embodiment of the invention, the formation of the etching neck extending the back-drill hole with a precisely controllable dimension may reduce the dimension of the remaining stub to a smaller value. Preferably, a vertical length of the stub remaining after etching the etching neck may be not more than 0.2 mm, in particular not more than 0.1 mm. Descriptively speaking, the etching neck may etch away part of the stub. Thereby, the RF properties of the component carrier may be significantly improved.

In another embodiment, the component carrier is completely free of an electrically conductive stub between the etching neck and the electrically conductive trace. In such a preferred embodiment, an extension of the etching neck is so long that no neck remains at all in the readily manufactured component carrier. This may be accomplished by controlling the length of the etching neck to correspond to the distance between an end portion of the back-drill hole and a vertical position of the electrically conductive trace.

In an embodiment, the end portion of the vertical through-connection is burr-free. In the context of the present application, the term "burr" may particularly denote a raised edge or small piece of electrically conductive material that remains attached to an end of the vertical through-connection after the drilling process for forming the back-drill hole. Such a burr is an unwanted piece of material in terms of high-frequency applications of the component carrier and may be removed partially or entirely with the etching process creating the etching neck for deburring the vertical through-connection. It has turned out that deburring the vertical through-connection by etching following formation of the back-drill hole may significantly reduce signal losses and improve signal quality in terms of RF tasks.

In an embodiment, the back-drill hole comprises a cylindrical section. The back-drill hole may for instance be formed by laser drilling or mechanically drilling. In both manufacturing processes, a substantially cylindrical extension of the back-drill hole may be obtained. In the case of mechanical drilling, this may be the result of the shape of a rotating shaft of a drill bit.

In an embodiment, the back-drill hole comprises a conical or frustoconical section between the cylindrical section and the etching neck. When formed by mechanically drilling, the above-mentioned cylindrical portion may be connected with a frustoconical or even conical end portion resulting from a tapering end portion of a drill bit which may be used for forming the back-drill hole. However, even in the presence of a tapering geometry of a frustoconical end portion, the narrowest portion of the blind hole formed in the stack may be defined by the etching neck.

In an embodiment, the etching neck has one of a cylindrical and a frustoconical shape. Since the neck is preferably formed by etching, its shape is also defined by an etching process. In case of a substantially anisotropic etching process, the sidewalls of the etching necks may be substantially vertical, and the shape of the etching neck may be substantially cylindrical. When, however, the etching process involves some non-anisotropic contribution, etching may not be carried out completely in a vertical direction so that the sidewalls of the etching neck may be slightly tapered or tapering.

In an embodiment, a diameter (in particular a maximum diameter) of the etching neck is smaller than a diameter (in particular a minimum diameter) of the back-drill hole. Thus, even a largest diameter of the etching neck may be smaller than a smallest diameter of the back-drill hole. A stack may for example be formed at a vertical interface between back-drill hole and etching neck.

In particular, the hole formed in a main surface of the stack by the back-drill hole and the etching neck may have an exterior cylindrical section of a first diameter followed by a directly connected frustoconical portion which is connected, in turn, to an interior cylindrical section of a second diameter being smaller than the first diameter. Such a geometry is shown for instance in FIG. 3.

In an embodiment, the vertical through-connection is configured as one of a cylindrical electrically conductive structure and a hollow cylindrical electrically conductive structure. For instance, only the sidewalls of a blind hole formed in the stack for creating the vertical through-connection may be covered with electrically conductive material such as copper. In such an embodiment, an interior of the vertical through-connection may remain hollow. In another embodiment, an entire blind hole formed for creating the vertical through-connection may be completely filled with an electrically conductive filling medium such as copper.

In an embodiment, the component carrier is configured for high-frequency applications. In particular, the component carrier may comprise at least one electronic component, in particular at least one RF semiconductor chip configured for emitting and/or receiving RF signals, mounted on and/or embedded in the stack and being electrically coupled with the electrically conductive trace and the vertical through-connection.

In an embodiment, the method comprises etching the etching neck by wet etching. Wet etching has turned out as a simple and well-defined process allowing, by an adjustment of the etching parameters, to precisely define the dimensions of the etching neck. Thereby, wet etching is a highly preferred method of forming the etching neck, since it may ensure at the same time a reliable improvement of the high-frequency properties of the component carrier as well as guaranteeing a reliable electric connection between trace and vertical through-connection.

In an embodiment, the method comprises etching the etching neck by alkaline etching, acid etching, etc. Thus, etching with an acid or a base etchant may both be highly appropriate methods of forming the etching neck by wet etching. Wet etching can be performed using acids and bases, both methods may be called wet etching (wet alkaline or wet acidic etching).

In another embodiment, the method comprises etching the etching neck by dry etching. In particular, the method may comprise etching the etching neck by plasma etching. As an alternative to wet etching, also a dry etching procedure can be applied to form the etching neck to keep the impact on the stack small. In particular plasma etching, i.e., treatment of the stack with a plasma for forming the etching neck, is highly suitable for defining the etching neck for improving the RF properties while ensuring a proper electric reliability of the obtained component carrier. Dry etching can be performed with plasma. Other possible dry etching methods are reactive ion etching (RIE) or laser ablation.

In an embodiment, the method comprises cleaning the back-drill hole with a rinse, such as a high-pressure rinse. Cleaning the black drill hole by rinsing, in particular before forming the etching neck, may improve the high-frequency performance of the obtained component carrier. This may further reduce a burr at a stub and may thus synergistically cooperate with the etching of a neck.

In an embodiment, the component carrier comprises a test structure which comprises at least one horizontally extending electrically conductive dummy trace at a vertical level of and connected to the back-drill hole and/or the etching neck. In particular, the test structure may be configured so that applying an electric test signal to one of the group consisting of the electrically conductive trace and the at least one horizontally extending electrically conductive dummy trace and detecting a response signal at another one of the group consisting of the electrically conductive trace and the at least one horizontally extending electrically conductive dummy trace is indicative of a functioning of the back-drill hole and/or the etching neck. Correspondingly, the method may comprise applying an electric test signal to one of the group consisting of the electrically conductive trace and at least one horizontally extending electrically conductive dummy trace provided at a vertical level of and connected to the back-drill hole and/or the etching neck, detecting a response signal at another one of the group consisting of the electrically conductive trace and the at least one horizontally extending electrically conductive dummy trace, and determining information indicative of a functioning of the back-drill hole and/or the etching neck based on the detected response signal. Descriptively speaking, when the back-drill hole is formed correctly, a dummy trace connected with the back-drill hole will not be capable of receiving an electric signal applied to the electrically conductive trace or the vertical through-connection (or applied in opposite direction), since the back-drill hole will disconnect the corresponding electric path. Correspondingly, when the etching neck is formed correctly, a dummy trace connected with the etching neck will not be capable of receiving an electric signal applied to the electrically conductive trace or the vertical through-connection (or applied in opposite direction), since the etching neck will disconnect the corresponding electric path. However, applying a test signal to or between traces connected with the vertical through-connection (for instance at the top side and at the bottom side) should allow detecting a response signal when the connection between the vertical through-connection and said trace(s) is properly established. Thus, the described embodiment allows reliably testing the functioning of the back-drill hole and the connected etching neck by carrying out a non-destructive test process using the described hardware test structure.

In an embodiment, the stack comprises a central electrically insulating layer structure covered on both opposing main surfaces thereof with a respective one of the at least one electrically conductive layer structure. For instance, such as stack may be a core. Such a core may have a central dielectric layer which may comprise resin, optionally comprising reinforcing particles such as glass fibers. For instance, the central dielectric layer may be a prepreg layer. The central dielectric layer may be covered on both opposing main surfaces with a respective copper foil or the like.

In an embodiment, the stack comprises at least one through hole being at least partially filled with an electrically conductive filling medium (such as plated copper) for electrically connecting opposing main surfaces of the stack. For instance, the through hole may be formed by laser processing or by mechanically drilling. The filling medium may be copper which may be inserted into the through hole for example by electroless deposition and/or plating. With such a plated via, a short vertical connection path between the two opposing main surfaces of the component carrier may be obtained which also suppresses signal loss.

In an embodiment, the component carrier is used for 5G (or higher versions, for instance 6G). Mobile wireless communication according to the 5G standard involves high-frequency transmission with a high transmitted data volume per time and therefore requires excellent properties in terms of high-frequency behavior. A component carrier according to an exemplary embodiment of the invention meets these demanding requirements. Fifth generation (5G) networks feature an increased mobile data rate, in particular significantly above 100 Mb/s. Fifth generation communication networks can experience superior network transmission fidelity when implementing a component carrier according to an exemplary embodiment of the invention.

In an embodiment, the component carrier is used for high-frequency applications above 1 GHz, in particular about 100 GHz. In particular for such high frequencies, signal transmission is particularly sensitive to stub caused parasitic effects. The high RF performance of component carriers according to exemplary embodiments of the invention allows low loss signal transmission even with such high-frequency values.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resins, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high-frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, it may be possible to create back-drill holes for HF boards (high-frequency boards) without burrs inside the holes. This may be carried out by forming a neck-shaped extension of a back-drill hole, in particular by etching.

Stubs may have a very high impact on the high-frequency performance of a component carrier. To reduce the stub length and increase the performance, back drilling of the remaining stub is advantageous. However, uncontrolled copper burr caused by the (in particular mechanical) back-drilling process may occur inside the hole, which has an additional undesired impact on the performance. According to an exemplary embodiment of the invention, an etching neck is formed to extend the back-drill hole for reducing the stub length, preferably to zero.

Back drilling is a technique to remove an unused portion (so-called stub) of a copper barrel from a plated through hole of a component carrier such as a printed circuit board (PCB). When high-speed signals travel between layers through a path, they can be distorted. If the signal layer usage results in a stub and the stub being too long, the distortion may become significant. With conventional processes, drilling burrs may occur inside the holes, which may have an impact on the performance, as this burr cannot be controlled properly. On the other hand, the remaining stub may be the longer side as the tolerances of the depth drilling needs to be considered as well. To avoid this issue, an exemplary embodiment of the invention additionally creates an etching neck, which may be formed by an (for instance alkaline) etching process. Such an additional etching procedure may be implemented as a separate stage after mechanical back drilling. Highly advantageously, this may remove the burr partially or completely, reduce additionally the remaining stub length and may safely prevent undesired damaging of the functional part of the hole itself.

Additionally, it may be possible to clean the back-drill hole with a high-pressure rinse, which may also reduce the burr. However, in order to obtain the best results, such a cleaning process may be combined or substituted by the described etching process for forming the etching neck. In particular, an exemplary embodiment of the invention allows to remove at least a significant portion of the stub and the burr. Thus, it may be safely prevented that a highly undesired uncontrolled excessive burr is present in the back-drill hole. Moreover, it may be additionally possible to reduce the remaining stub length and thereby obtain a more stable and repeatable performance of HF features.

Exemplary applications of exemplary embodiments of the invention are component carriers with high-frequency applications in which back drilling is advantageous, rinsing of the back-drill hole is possible and reduction of a stub length and removal of a burr is accomplished by forming an etching neck.

For instance, component carriers according to exemplary embodiments of the invention may be operated with signals having a frequency of at least 20 GHz. In particular, in this frequency domain, interferences in laser through holes may conventionally occur.

According to an exemplary embodiment of the invention, it may be possible to carry out a burr-free back drilling of HF boards. Driven by steadily increasing bandwidth demands and amount of data which has to be handled, the transmitting channels within the PCB can be improved or even optimized according to exemplary embodiments of the invention.

There are in particular three main parameters of component carriers which may be considered to reduce the insertion loss. These parameters are related to the use of materials (preferably low k materials), copper loss (by using foils with a low treatment), and the via structure. The via structure, especially if the via extends significantly beyond the layer that needs to be electrically connected, may have a huge negative impact on the insertion loss profile. Back drilling is a technique to remove an unused portion (which may be denoted as stub) of a copper barrel from a plated through hole in a PCB or another component carrier. When high-speed signals travel between layers through a path, the signals can be distorted. If the signal layer usage results in a stub and the stub is too long, the distortion becomes significant.

In view of the foregoing, exemplary embodiments of the invention provide a manufacturing procedure allowing to (partially or preferably completely) remove burrs inside back-drilled plated through holes.

With existing processes, a drilling burr may occur inside the holes, which has an undesired impact of the performance, as this burr cannot be controlled properly. On the other hand, a remaining stub may be at the longer side as the tolerances of the depth drilling have to be considered. Cross sections of conventional component carriers show the presence of unwanted inner layer connections and a significant drilling burr.

According to an exemplary embodiment of the invention, an (in particular alkaline) etching process may be carried out to at least reduce the above-described shortcomings. To avoid these and/or other issues, an (for instance alkaline) etching stage may be implemented after back drilling to remove the burr partially or completely, and to at least reduce additionally the remaining stub length without damaging the functional part of the hole itself.

A process flow of an exemplary embodiment of the invention implementing the described back drilling with an additional alkaline etching process may be as follows: After a last pressing cycle of forming the stack, mechanical drilling may be carried out followed by a copper process. Thereafter, a photo process (which may involve lamination, exposing and developing) and a galvanic tin build up process may follow. Thereafter, back drilling may be accomplished. This may be followed by an alkaline etching process for forming the etching neck. After that, manufacture of the component carrier may be continued in a conventional way.

Figure 1:
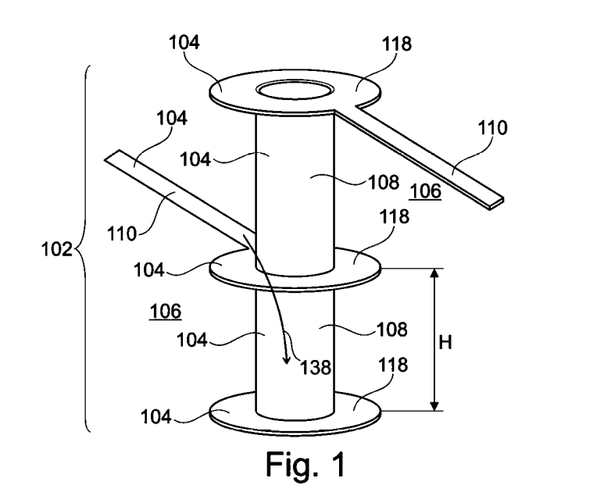
FIG. 1, FIG. 2 and FIG. 3 illustrate three-dimensional views of structures obtained during carrying out a method of manufacturing a component carrier according to an exemplary embodiment of the invention, shown in FIG. 3.
Figure 2:
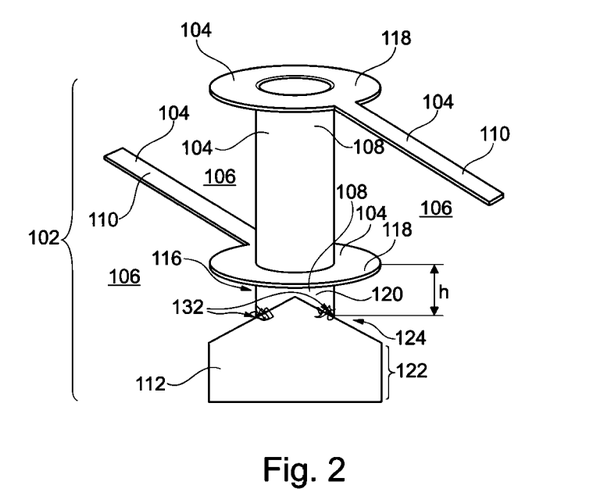
Figure 3:
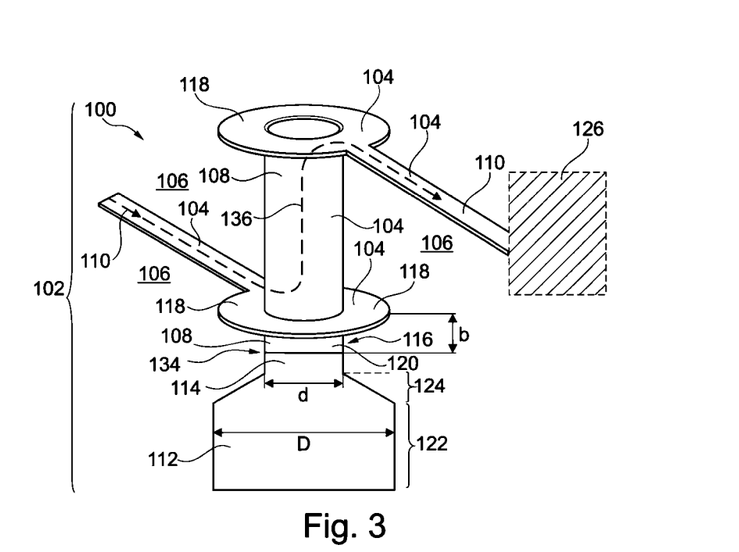

FIG. 1 to FIG. 3 illustrate three-dimensional views of structures obtained during carrying out a method of manufacturing a component carrier 100 according to an exemplary embodiment of the invention, shown in FIG. 3.

Referring to FIG. 1, a laminated stack 102 is illustrated which is composed of electrically conductive layer structures 104 and electrically insulating layer structures 106. For example, the electrically conductive layer structures 104 may comprise patterned copper foils and vertical through-connections, for example copper filled laser vias. The electrically insulating layer structures 106 may comprise a resin (such as epoxy resin), optionally comprising reinforcing particles therein (for instance glass fibers or glass spheres). For instance, the electrically insulating layer structures 106 may be made of prepreg or FR4. The layer structures 104, 106 may be connected by lamination, i.e., the application of pressure and/or heat.

As shown, the electrically conductive layer structures 104 comprise an electrically conductive vertical through-connection 108 and horizontally extending electrically conductive traces 110 which are electrically coupled with the vertical through-connection 108 at different vertical levels. Furthermore, pads 118 are provided at different vertical levels which are electrically connected with the vertical through-connection 108 and a respective one of the traces 110. Thus, FIG. 1 shows a laterally stacked arrangement of various sections of the vertical through-connection 108 being traversed by lands or pads 118. A respective trace 110 is connected via an assigned land or pad 118 to a respective portion of the vertical through-connection 108. In the readily manufactured component carrier 100 shown in FIG. 3, an electric signal (in particular a high-frequency signal, preferably having a frequency of 20 GHz or above) shall be conducted between the two electrically conductive traces 110 by the vertical through-connection 108 in between. At a bottom side of the vertical through-connection 108 below the lower trace 110 according to FIG. 1, a parasitic section of the vertical through-connection 108 is shown which has a vertical extension H. If the structure shown in FIG. 1 was used for transmitting high-frequency signals, said parasitic section would significantly deteriorate the signal quality due to the creation of a parasitic propagation path denoted with reference sign 138.

Referring to FIG. 2, a back-drill hole 112 may be drilled through part of the electrically insulating layer structures 106 from a back side of stack 102 towards an end portion 116 of the vertical through-connection 108 and may also remove part of the material of the vertical through-connection 108 (in particular copper). The length of the parasitic section of the vertical through-connection 108 may thereby be reduced to a length h of a remaining metallic stub 120, wherein H>h. Such a back drill may improve the high-frequency performance of the component carrier 100 been presently manufactured. For instance, it is possible to mechanically drill the back-drill hole 112 by a rotating drill bit having a substantially cylindrical shaft and a conical or frustoconical tip (not shown). If the back-drill hole 112 is formed by mechanical drilling, it may have thus the shown shape with a major cylindrical section 122 and a vertically smaller conical or frustoconical extension 124. Formation of the back-drill hole 112 extending from the back side of the stack 102 up to the above-described via stub 120 may improve the high-frequency performance of the component carrier 100 to be manufactured, since the vertical extension h of the remaining stub 120 can be already significantly reduced compared to FIG. 1. As indicated with reference signs 132, mechanically drilling the back-drill hole 112 may however generate an undesired burr of copper material at an interface between the remaining stub 120 and the back-drill hole 112. Both the burr 132 as well as the remaining stub 120 of length h may deteriorate the RF performance, since they may disturb signal propagation along the desired path between the traces 110 connected via the vertical through-connection 108.

Subsequently, the back-drill hole 112 may be optionally cleaned with a high-pressure rinse. This may already have a positive impact on the high-frequency properties.

Referring to FIG. 3, an etching neck 114 is created between the back-drill hole 112 and the end portion 116 of the vertical through-connection 108 by an additional etching procedure carried out subsequently to the back-hole drilling (and subsequent to the optional rinsing). More specifically, the etching neck 114 may be created by wet etching, for instance alkaline etching.

As shown, the hole formed in the stack 102 by back drilling and neck etching may have an exterior cylindrical section 122 of first diameter D followed by directly connected frustoconical extension 124 which is directly connected, in turn, to an interior cylindrical section in form of etching neck 114 of a second diameter d being smaller than the first diameter D, i.e., d<D.

Optionally, a component 126 (for instance a high-frequency semiconductor chip) may be embedded in the stack 102 and may be electrically connected to the traces 110 and the vertical through-connection 108. For instance, the component carrier 100 with the embedded RF component 126 may be used for wireless communication according to 5G (or higher, for instance 6G).

As a result of this manufacturing method, the component carrier 100 illustrated in FIG. 3 may be obtained. Said component carrier 100 comprises stack 102 composed of electrically conductive layer structures 104 and electrically insulating layer structures 106. As shown, the electrically conductive layer structures 104 comprise electrically conductive vertical through-connection 108 and horizontally extending electrically conductive traces 110, one of which being electrically coupled with end portion 116 of the vertical through-connection 108. Back-drill hole 112 extends through part of the stack 100. Etching neck 114 is formed to connect the back-drill hole 112 with the end portion 116 of the vertical through-connection 108. The vertical through-connection 108 is a plated via. The vertical through-connection 108 may be configured as a cylindrical electrically conductive structure or as a hollow cylindrical electrically conductive structure, preferably made of copper. Lands or pads 118 electrically connect the electrically conductive traces 110 with the vertical through-connection 108.

Moreover, the vertical through-connection 108 comprises the now shortened electrically conductive stub 120 between the etching neck 114 and the lower land or pad 118. Shortening the stub 120 is a consequence of the formation of the etching neck 114. Furthermore, formation of the etching neck 114 removes burr 132 partially or entirely, see reference sign 134 in FIG. 3. In view of this configuration, the component carrier 100 is configured to be highly appropriate for high-frequency applications with signal frequencies above 1 GHz. As indicated with reference sign 136 in FIG. 3, a high-frequency signal propagating between the traces 110 along the vertical through-connection 108 can now be conducted substantially without being disturbed by the parasitic effects described referring to FIG. 1 and FIG. 2.

The component carrier 100 according to FIG. 3 can be obtained by firstly rinsing the back-drill hole 112 and subsequently carrying out an alkaline etch procedure from the lower side of the stack 102 to thereby form the narrow upward extension of the back-drill hole 112 in form of the etching neck 114. The advantages of this are two-fold: Firstly, the burrs 132 shown in FIG. 2 may be removed, as indicated schematically by reference sign 134 in FIG. 3. Moreover, the vertical dimension of an optionally remaining stub 120 may be further reduced to a value b<h. Thus, the RF performance of the component carrier 100 is highly appropriate, since substantially no undesired propagation of an RF signal to undesired portions of the component carriers 100 is allowed. Thus, an RF signal propagates substantially along a desired propagation path 136 indicated schematically in FIG. 3. An undesired signal path as indicated schematically with reference numeral 138 in FIG. 1 may thus be prevented. Descriptively speaking, the parasitic section of length H in FIG. 1 and the stub of length h in FIG. 2 may function as a parasitic antenna and may therefore significantly disturb the signal. In the embodiment shown in FIG. 3, the remaining length of the stub 120, b, may for example be less than 0.2 mm, in particular less than 0.1 mm. It may even be substantially zero (compare for example FIG. 5) when the etching process is controlled in a corresponding way.

Although not shown in FIG. 3, it may also be possible to fill up at least part of the back-drill hole 112, optionally including at least part of the etching neck 114 with a plug, preferably made of an electrically insulating plug material. This may prevent material from undesirably entering the interior of the component carrier 100.

Figure 4:
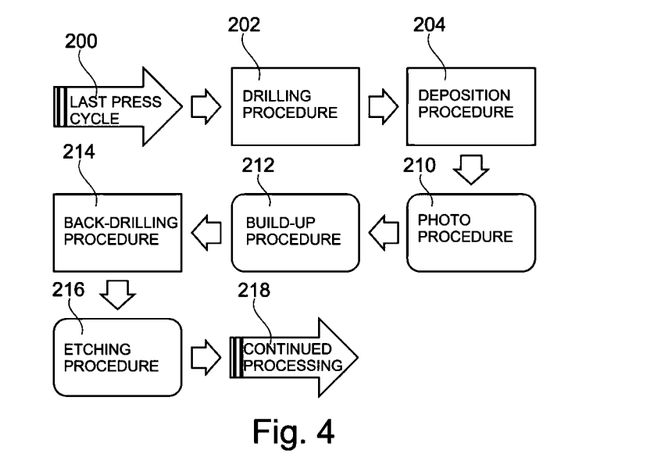
FIG. 4 illustrates a flowchart of a method of manufacturing a component carrier according to an exemplary embodiment of the invention.

FIG. 4 illustrates a flowchart of a method of manufacturing a component carrier 100 according to an exemplary embodiment of the invention.

As indicated in reference numeral 200, the stack 102 of layer structures 104, 106 may already have undergone a last pressing cycle. As indicated by reference numeral 202, a mechanical drilling process may then be carried out. As indicated by reference sign 204, a copper deposition process may then be carried out for forming the vertical through-connection 108. This may be followed by a photo process, see reference sign 210, which may involve lamination, exposure and development. Thereafter, a galvanic tin build-up process may be carried out, see reference sign 212. As indicated by block 214, a back-drilling process may then be carried out for forming back-drill hole 112 by mechanically drilling. Subsequently, an alkaline etching process may be carried out, see block 216, for forming the etching neck 114. Component carrier manufacture may then be continued in a conventional way according to block 218.

Figure 5:
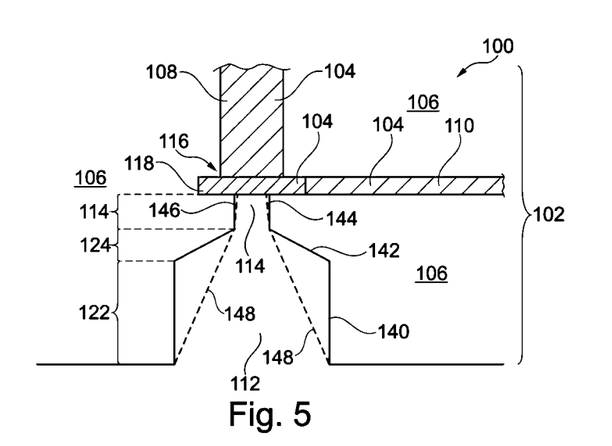
FIG. 5 illustrates a component carrier according to another exemplary embodiment of the invention being free of any stub.

FIG. 5 illustrates a component carrier 100 according to another exemplary embodiment of the invention being free of any stub. As indicated with reference numeral 140, the lower section of the back-drill hole 112 may have vertical sidewalls. An upper portion of the back-drill hole 112 may have slanted sidewall portions which may taper inwardly, see reference numeral 142. This may generate a frustoconical portion 124 of the back-drill hole 112. The etched etching neck 114 may have vertical sidewalls, see reference sign 144. However, when the etching process is not ideally anisotropic, it may also be that the sidewalls of the etching neck 114 taper inwardly, see reference sign 146. Correspondingly, when the back-drill hole 112 is not formed by mechanically drilling, but for instance by laser drilling, it may also have slanted sidewalls, see reference sign 148. In the latter case, it is also possible that the back-drill hole 112 as a whole has frustoconical shape.

Figure 6:
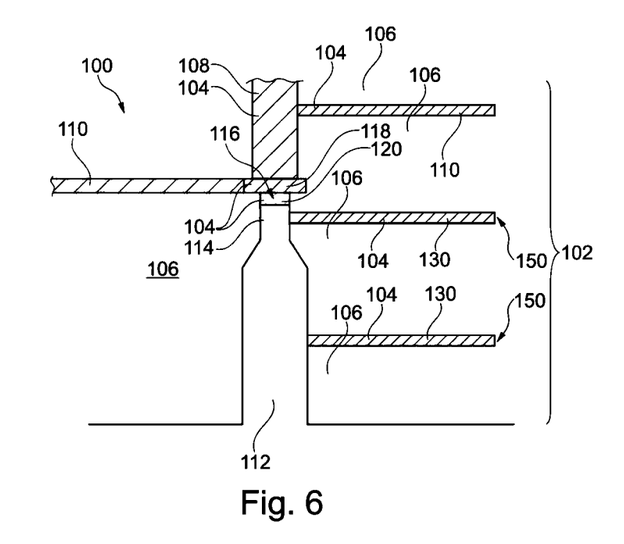
FIG. 6 illustrates a component carrier according to yet another exemplary embodiment of the invention comprising a test structure for carrying out a destruction-free test of the intactness of the component carrier.

FIG. 6 illustrates a component carrier 100 according to yet another exemplary embodiment of the invention comprising a test structure 150 for carrying out a destruction-free test of the intactness of the component carrier 100.

The test structure 150 has, in the shown embodiment two, horizontally extending electrically conductive dummy traces 130. A lower dummy trace 130 is arranged at a vertical level of and is connected to the back-drill hole 112. Another upper dummy trace 130 is arranged at a vertical level of and is connected to the etching neck 114. Moreover, the test structure 150 is configured for applying an electric test signal to one of the electrically conductive traces 110 and for detecting a response signal at the respective dummy trace 130. The measured response signal is indicative of a functioning of the back-drill hole 112 and the etching neck 114. It is then possible to determine information indicative of a functioning of the back-drill hole 112 and/or the etching neck 114 based on the detected response signal. For instance, if the back-drill hole 112 is properly formed, no signal will be detected at the dummy trace 130 connected to the back-drill hole 112. If the etching neck 114 is properly formed, no signal will be detected at the dummy trace 130 connected to the etching neck 114.

Thus, the high frequency capable PCB component carrier 100 of FIG. 6 may be made subject to a functional test. As shown, a plurality of test or dummy traces 130 may be provided in addition to functional trace 110 at different vertical levels of the stack 102, in the shown embodiment above and at the back-drill hole 112. By executing an electric test with the test or dummy traces 130, the proper formation of the back-drill hole 112 as well as of the etching neck 114 may be ensured without destroying the component carrier 100. In the shown embodiment, a test signal may not be transmitted between the lower test or dummy trace 130 and the functional traces 110, since the lower test or dummy trace 130 ends at the back-drill hole 112 which thereby disables the described electric test path. In a corresponding way, a test signal may not be transmitted between the upper test or dummy trace 130 and the functional traces 110, since the upper test or dummy trace 130 ends at the etching neck 114, because the etching recess 114 is properly formed and thereby disables the described electric test path. Thus, the correct formation and in particular height of the back-drill hole 112 and the etching neck 114 can be tested in a non-destructive way using the test structure 150 described referring to FIG. 6.

Figure 7:
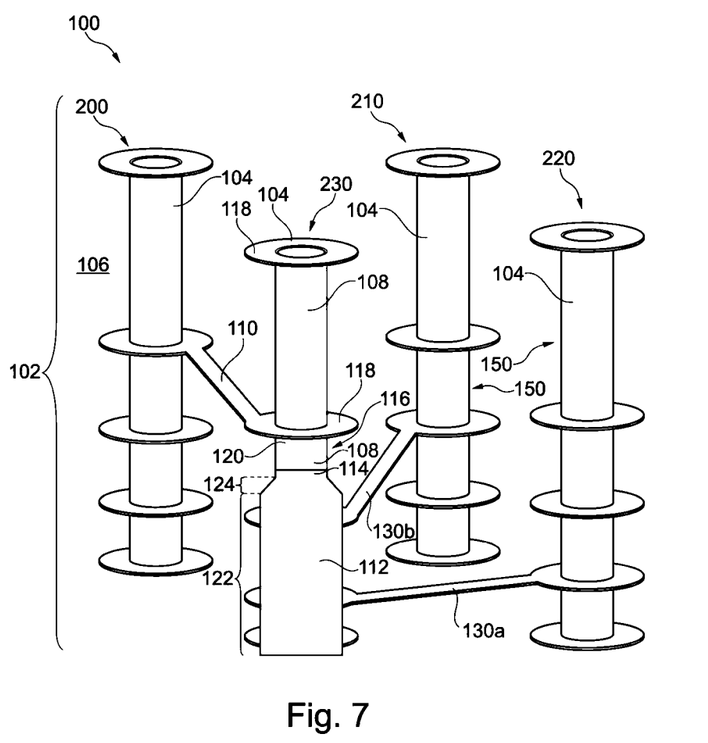
FIG. 7 illustrates a component carrier according to yet another exemplary embodiment of the invention comprising a test structure for carrying out an electric test for testing integrity of the component carrier.

FIG. 7 illustrates a component carrier 100 according to yet another exemplary embodiment of the invention comprising a test structure 150 for carrying out an electric test for testing integrity of the component carrier 100.

Also referring to the similar embodiment of FIG. 6, the illustrated test structure 150 makes it possible to test whether a proper electric connection is established between a reference drill structure 230 with the back-drill hole 112 and a mandatory connection structure 200. Only if current flows along trace 110, the component carrier 100 can be accepted as working properly. Moreover, the illustrated test structure 150 makes it possible to test whether an electric connection lacks between a no-connection-allowed structure 220 and the reference drill structure 230. Only if no current flows along a first dummy trace 130a, the component carrier 100 can be accepted as working properly. Furthermore, no electric current should flow between the reference drill structure 230 and a target layer structure 210 along a second dummy trace 130b. Hence, the component carrier 100 according to FIG. 7 allows to provide an electric test fiducial back/depth drilling structure.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a stack comprising a plurality of electrically conductive layer structures and at least one electrically insulating layer structure;
   wherein the electrically conductive layer structures comprise an electrically conductive vertical through-connection and a horizontally extending electrically conductive trace electrically coupled with an end portion of the vertical through-connection;
   a back-drill hole extending through at least part of the at least one electrically insulating layer structure towards the end portion; and
   an etching neck extending from the back-drill hole to the end portion of the vertical through-connection, the etching neck defined by a surface of the at least one electrically insulating layer structure,
   wherein the vertical through-connection comprises an electrically conductive stub between the etching neck and the electrically conductive trace, and
   wherein a length of the electrically conductive stub is larger than a length of the etching neck.

2. The component carrier according to claim 1, comprising at least one of the following features:
   wherein the vertical through-connection is a plated via;
   a pad electrically connecting the electrically conductive trace with the vertical through-connection;
   wherein a vertical length of the stub is not more than 0.2 mm;
   wherein the end portion of the vertical through-connection is burr-free;
   wherein the back-drill hole comprises a cylindrical section;
   wherein the back-drill hole comprises a conical or frustoconical section between the cylindrical section and the etching neck;
   wherein the etching neck has one of a cylindrical shape and a frustoconical shape;
   wherein a diameter of the etching neck is smaller than a diameter of the back-drill hole;
   wherein the vertical through-connection is configured as one of a cylindrical electrically conductive structure and a hollow cylindrical electrically conductive structure;
   wherein the component carrier is configured for high-frequency applications;
   at least one electronic component coupled to the at least one electrically conductive layer structures;
   wherein the at least one electronic component comprises a radio-frequency semiconductor chip, configured for emitting and/or receiving radio-frequency signals, mounted on and/or embedded in the stack and being electrically coupled with the electrically conductive trace and the vertical through-connection.

3. The component carrier according to claim 1, further comprising:
a test structure which comprises at least one horizontally extending electrically conductive trace at a vertical level of and connected to the etching neck.

4. The component carrier according to claim 3,
wherein the test structure is configured so that applying an electric test signal to one of the group consisting of the electrically conductive trace and the at least one horizontally extending electrically conductive trace connected to the etching neck and detecting a response signal indicative of a functioning of the back-drill hole and/or the etching neck.

5. The component carrier according to claim 1, comprising at least one of the following features:
at least one component being surface mounted on and/or embedded in the component carrier, wherein the at least one component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of the group consisting of copper, aluminum, nickel, silver, gold, palladium, and tungsten;
wherein the at least one electrically insulating layer structure comprises at least one of the group consisting of reinforced or non-reinforced resin, epoxy resin or bismaleimide-triazine resin, FR-4, FR-5, cyanate-ester based resin, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

6. A method of manufacturing a component carrier, comprising:
providing a stack comprising a plurality of electrically conductive layer structures and at least one electrically insulating layer structure;
forming the electrically conductive layer structures with an electrically conductive vertical through-connection and a horizontally extending electrically conductive trace electrically coupled with the vertical through-connection;
drilling a back-drill hole through at least part of the at least one electrically insulating layer structure and into the vertical through-connection; and
etching an etching neck between the back-drill hole and an end portion of the vertical through-connection, the etching neck defined by a surface of the at least one electrically insulating layer structure,
wherein the vertical through-connection comprises an electrically conductive stub between the etching neck and the electrically conductive trace, and
wherein a length of the electrically conductive stub is larger than a length of the etching neck.

7. The method according to claim 6, wherein etching the etching neck comprises wet etching.

8. The method according to claim 7, wherein etching the etching neck comprises alkaline etching or acid etching.

9. The method according to claim 6, wherein etching the etching neck comprises dry etching.

10. The method according to claim 9, wherein dry etching comprises plasma etching.

11. The method according to claim 6, further comprising: cleaning the back-drill hole with a rinse.

12. The method according to claim 6, wherein drilling comprises mechanically drilling the back-drill hole.

13. The method according to claim 6, further comprising:
applying an electric test signal to one of the group consisting of the electrically conductive trace and at least one horizontally extending electrically conductive trace provided at a vertical level of and connected to the etching neck;
detecting a response signal at another one of the group consisting of the electrically conductive trace and the at least one horizontally extending electrically conductive dummy trace; and
determining information indicative of a functioning of the back-drill hole and/or the etching neck based on the detected response signal.

14. A component carrier, comprising:
a stack comprising a plurality of electrically conductive layer structures and at least one electrically insulating layer structure; wherein the electrically conductive layer structures comprise an electrically conductive vertical through-connection and a horizontally extending electrically conductive trace electrically coupled with an end portion of the vertical through-connection;
a back-drill hole extending through at least part of the at least one electrically insulating layer structure towards the end portion;
an etching neck extending from the back-drill hole to the end portion of the vertical through-connection, the etching neck defined by a surface of the at least one electrically insulating layer structure, wherein a diameter of the etching neck is smaller than a diameter of the back-drill hole; and a test structure which comprises at least one horizontally extending electrically conductive trace at a vertical level of and connected to the etching neck.

* * * * *

UNITED STATES PATENT AND TRADEMARK OFFICE
CERTIFICATE OF CORRECTION

| | |
|---|---|
| PATENT NO. | : 11,399,432 B2 |
| APPLICATION NO. | : 17/248109 |
| DATED | : July 26, 2022 |
| INVENTOR(S) | : Markus Kastelic and Sebastian Lackner |

It is certified that error appears in the above-identified patent and that said Letters Patent is hereby corrected as shown below:

On the Title Page

Item [72] in the second line, please replace "Lackner Sebastian, Kammern (AT)" with "Sebastian Lackner, Kammern (AT)".

Signed and Sealed this
First Day of October, 2024

Katherine Kelly Vidal
*Director of the United States Patent and Trademark Office*